(12) United States Patent
Berkel

(10) Patent No.: US 10,524,347 B2
(45) Date of Patent: Dec. 31, 2019

(54) CIRCUIT BOARD

(71) Applicant: Schoeller Electronics Systems GmbH, Wetter/Hessen (DE)

(72) Inventor: Jan Hendrik Berkel, Rijssen (NL)

(73) Assignee: Schoeller Electronics Systems GmbH, Wetter/Hessen (DE)

( * ) Notice: Subject to any disclaimer, the term of this patent is extended or adjusted under 35 U.S.C. 154(b) by 319 days.

(21) Appl. No.: 14/062,435

(22) Filed: Oct. 24, 2013

(65) Prior Publication Data
US 2014/0111945 A1 Apr. 24, 2014

(30) Foreign Application Priority Data

Oct. 24, 2012 (DE) .................. 10 2012 020 838

(51) Int. Cl.
*H05K 1/02* (2006.01)
*H05K 3/00* (2006.01)
(Continued)

(52) U.S. Cl.
CPC ........... *H05K 1/0203* (2013.01); *H05K 1/021* (2013.01); *H05K 3/0011* (2013.01);
(Continued)

(58) Field of Classification Search
CPC ........ H05K 1/0203; H05K 3/303; H05K 3/10; H05K 1/021; H05K 3/0061; H05K 3/0011; H05K 1/0215; H05K 1/0243; H05K 2201/066; H05K 3/3452; H05K 2201/09063; H05K 1/0201; H05K 1/0204;
(Continued)

(56) References Cited

U.S. PATENT DOCUMENTS 3,982,271 A * 9/1976 Olivieri .................. H01L 23/32
257/664
6,292,374 B1 * 9/2001 Johnson ............... H05K 1/0204
174/252

(Continued)

FOREIGN PATENT DOCUMENTS

DE 102012020838 4/2014
EP 1377143 1/2004

(Continued)

OTHER PUBLICATIONS

"European Search Report," for co-pending European Patent Application No. 13185946 related to U.S. Appl. No. 14/062,435, dated Feb. 3, 2014 (2 pages).

*Primary Examiner* — Jerry Wu
*Assistant Examiner* — Stephen S Sul
(74) *Attorney, Agent, or Firm* — Pauly, DeVries Smith & Deffner LLC

(57) ABSTRACT

The invention relates to a circuit board for populating with at least one electronic component, at least one heat conducting element being provided, connected to a surface of a sheet-like circuit board body by way of a boundary layer. The boundary layer consists in certain areas of an electrically non-conducting layer and in certain areas of an electrically conducting layer, the non-conducting layer combining with the circuit board body and the heat conducting element to provide at least one receiving space with a pocket-like volume for the conducting layer.

17 Claims, 3 Drawing Sheets

(51) Int. Cl.
*H05K 3/10* (2006.01)
*H05K 3/30* (2006.01)
*H05K 3/34* (2006.01)

(52) U.S. Cl.
CPC ............ *H05K 3/0061* (2013.01); *H05K 3/10* (2013.01); *H05K 3/303* (2013.01); *H05K 1/0215* (2013.01); *H05K 1/0243* (2013.01); *H05K 3/3452* (2013.01); *H05K 2201/066* (2013.01); *H05K 2201/09063* (2013.01); *Y10T 29/49144* (2015.01); *Y10T 29/49155* (2015.01)

(58) Field of Classification Search
CPC .. H05K 1/0206; H05K 1/0207; H05K 1/0209; H05K 1/0212; H05K 1/05; H05K 2201/09054; H05K 2201/09772; H05K 1/0272; H05K 1/0296; H05K 7/205; Y10T 29/49155; Y10T 29/49144; H01R 23/6806
USPC ............ 361/720, 764; 174/252; 29/840, 846
See application file for complete search history.

(56) References Cited

U.S. PATENT DOCUMENTS

| | | | |
|---|---|---|---|
| 6,842,341 B1 * | 1/2005 | Waldvogel | H05K 1/021 |
| | | | 257/706 |
| 2003/0100197 A1 | 5/2003 | Veitschegger et al. | |
| 2008/0190595 A1 * | 8/2008 | Sjodin | B23K 1/0012 |
| | | | 165/167 |
| 2010/0186226 A1 * | 7/2010 | Amirparviz | H01L 24/81 |
| | | | 29/832 |
| 2012/0111623 A1 * | 5/2012 | Chen | H05K 1/0216 |
| | | | 174/260 |
| 2013/0180105 A1 * | 7/2013 | Moul | H01P 11/003 |
| | | | 29/846 |

FOREIGN PATENT DOCUMENTS

| | | |
|---|---|---|
| EP | 1480264 | 11/2004 |
| WO | 2006099811 | 9/2006 |

* cited by examiner

CIRCUIT BOARD

CLAIM OF PRIORITY

This application claims the benefit of German Patent Application No. DE 10 2012 020 838.3, filed Oct. 24, 2012, the disclosure of which is incorporated by reference herein in its entirety.

FIELD OF THE INVENTION

The invention relates to a circuit board for populating with at least one electronic component and to a method for producing such a circuit board.

BACKGROUND

The prior art discloses printed electronic circuits in the case of which circuit boards are populated with electronic components. Such circuit boards may consist of one or more individual layers of fibreglass-reinforced, cured epoxy resin sheets that are copper-clad on one or both sides for the formation of traces. This arrangement of one or more individual layers is referred to in the present case as the "circuit board body".

Because of the relatively high loss of power of the electronic components arranged on it, a circuit board that has been populated with components and is in operation undergoes the development of a great amount of heat. To dissipate the heat that is attributable to the loss of power, it is known to provide a heat conducting element in the form of a metal body. The heat conducting element often consists of copper or a comparable material that has good heat conductivity. The heat conducting element provided in the circuit board ensures sufficient removal of the lost heat from the electronic components and thereby prevents the components and the circuit board from reaching a critical temperature range.

Apart from the heat conduction, the heat conducting element often has the additional function of providing an earth connection for the component concerned. In the case of a known arrangement, the electronic component is in thermal and electrical contact with the heat conducting element through a clearance in the circuit board body. The fact that the heat conducting element provides a low-resistance electrical connection to an earth layer of the circuit board is then of particular importance. In the case of high-frequency arrangements, there is additionally the requirement to provide the earth contact between the heat conducting element and the earth layer of the circuit board as close as possible to the electronic component, so that the buildup of interference fields is suppressed. The above earth layer of the circuit board usually extends over a significant part of the surface area of the circuit board body.

In the case of the circuit board in question, the heat conducting element is connected to a surface of the circuit board body by way of an adhesive boundary layer. This involves using an electrically and thermally conducting adhesive, which provides the electrical contact between the heat conducting element and the earth layer of the circuit board. The conducting boundary layer in this case extends over a large surface area of the heat conducting element.

The fact that it is costly to use the conductive adhesive over a large surface area is problematic in the case of the known circuit board.

The invention addresses the problem of configuring and developing the known circuit board in such a way that less costly production is possible.

SUMMARY

The above problem is solved by a circuit board with the features according to the following. The proposed solution is based in the first instance on the idea of building up the boundary layer specifically in certain areas from an electrically non-conducting layer and in certain areas from an electrically conducting layer. This makes it possible in principle to provide the cost-intensive electrically conducting layer only where it is particularly required for the production of an earth contact.

An essential factor is therefore the recognition that the non-conducting layer can be used to provide a receiving space for the conducting layer. To be specific, the non-conducting layer combines with the circuit board body and the heat conducting element to form at least one receiving space with a pocket-like volume for the conducting layer.

The proposed solution gives rise to numerous possibilities for the design of the conducting layer. In particular, the conducting layer does not have to be an adhesive layer. In an embodiment, the conducting layer is in one variant a meltable layer, in particular a solder layer.

In an embodiment, the conducting layer that has melted during a soldering process still to be explained is kept in the receiving space by capillary action. Further, the pocket height of the receiving space to be maintained for this is determined by the layer thickness of the non-conducting layer.

According to further teaching, of importance in its own right, a method for the production of a circuit board is claimed.

An essential factor in this respect is the fact that the above boundary layer for the connection of the heat conducting element to the surface of the circuit board body is produced in such a way that the non-conducting layer provides the explained receiving space with a pocket-like volume for the conducting layer.

Reference may be made to all of the embodiments of the circuit board as proposed that are suitable for describing the method for the production of this circuit board.

In an embodiment the invention provides a circuit board for populating with at least one electronic component, at least one heat conducting element being provided, connected to a surface of a sheet-like circuit board body by way of a boundary layer, the boundary layer consisting in certain areas of an electrically non-conducting layer and in certain areas of an electrically conducting layer, the non-conducting layer combining with the circuit board body and the heat conducting element to provide at least one receiving space with a pocket-like volume for the conducting layer.

In one embodiment, the conducting layer consists of a meltable layer, and/or in that the non-conducting layer consists of a thermally activatable adhesive film.

In one embodiment, the pocket height (T) of the receiving space is so small that, the still liquid, in particular melted conducting layer is kept in the receiving space by capillary action during the production of the circuit board.

In one embodiment, the conducting layer provides an earth connection between the heat conducting element and an earth layer of the circuit board body.

In one embodiment, the populated state of the circuit board, at least one electronic component is electrically contacted at the heat conducting element and at at least one signal trace of the circuit board body and in that the heat conducting element is electrically contacted by way of the conducting layer at an earth layer of the circuit board body.

In one embodiment, the circuit board body has at least one clearance for receiving an electronic component or for receiving the heat conducting element.

In one embodiment, the populated state of the circuit board, an electronic component assigned to the clearance is in heat-conducting and electrical contact with the heat conducting element in the region of the clearance, in particular through the clearance.

In one embodiment, the heat conducting element has a trough-like formation for receiving the electronic component.

In one embodiment, the receiving space for the conducting layer is situated in the region of the clearance.

In one embodiment, the receiving space for the conducting layer is situated at the edge of the clearance, so that the receiving space is open on one side towards the clearance.

In an embodiment the invention provides a method for the production of a circuit board, a boundary layer for the connection of a heat conducting element to a surface of a sheet-like circuit board body being produced in such a way that the boundary layer consists in certain areas of an electrically non-conducting layer and in certain areas of an electrically conducting layer and the non-conducting layer combines with the surface of the circuit board body and the heat conducting element to provide at least one receiving space with a pocket-like volume for the conducting layer.

In one embodiment, to produce the boundary layer, at least part of the conducting layer is applied to the heat conducting element and/or to the circuit board body, before or after the non-conducting layer is applied to the heat conducting element and/or the circuit board body and in that the heat conducting element is subsequently connected to the circuit board body by way of the boundary layer.

In one embodiment, the connection of the heat conducting element to the circuit board body takes place by the effect of activation heat.

In one embodiment, in a subsequent step, the circuit board is populated with at least one electronic component and soldered in a soldering process and in that, during the soldering process, the conducting layer is melted by the effect of heat attributable to the soldering process.

In one embodiment, the meltable layer, comprises a solder layer.

In one embodiment, the pocket height (T) of the receiving space is determined by the layer thickness of the non-conducting layer.

In one embodiment, at least one signal contact on the upper side of the circuit board body has lying opposite it an earth contact on the underside of the circuit board body.

In one embodiment, the electronic component is in surface-area contact with the heat conducting element.

In one embodiment, to produce the boundary layer, at least part of the conducting layer is applied to the heat conducting element and/or to the circuit board body, in a bonding manner.

In one embodiment, the non-conducting layer consists of a thermally activatable adhesive.

In one embodiment, a thermally activatable adhesive film, and in that the activation heat activates the adhesive or the adhesive film.

In one embodiment, the activation heat is so little that it does not melt the conducting layer.

BRIEF DESCRIPTION OF THE FIGURES

The invention is explained in more detail below on the basis of a drawing that merely represents an exemplary embodiment. In the drawing.

DETAILED DESCRIPTION

Figure 1:
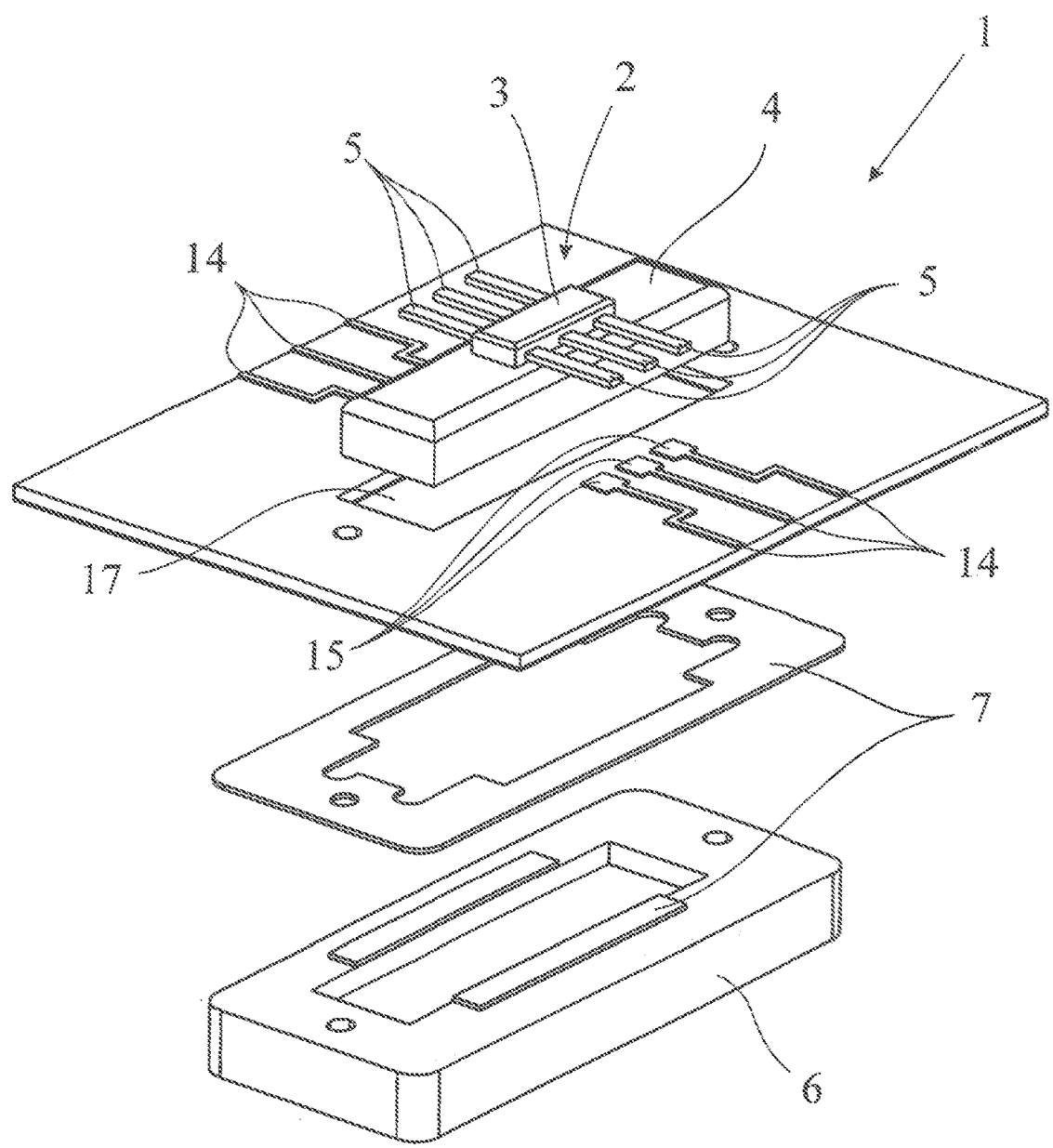
FIG. 1 shows a circuit board as proposed in an exploded representation.

The circuit board 1 represented in the drawing can be populated for the intended purpose with at least one electronic component 2. The component 2 represented is an integrated circuit 3, which is arranged on a small metal plate 4. The small metal plate 4 serves on the one hand for earthing and on the other hand for dissipating the heat attributable to the loss of power of the component 2. The component 2 is also provided with contact tongues 5, which serve for the electrical contacting of the integrated circuit 3.

FIG. 1 also shows a heat conducting element 6, which consists of metal, in particular of copper. In principle, all materials that have good heat conductivity can be used here.

Figure 2:
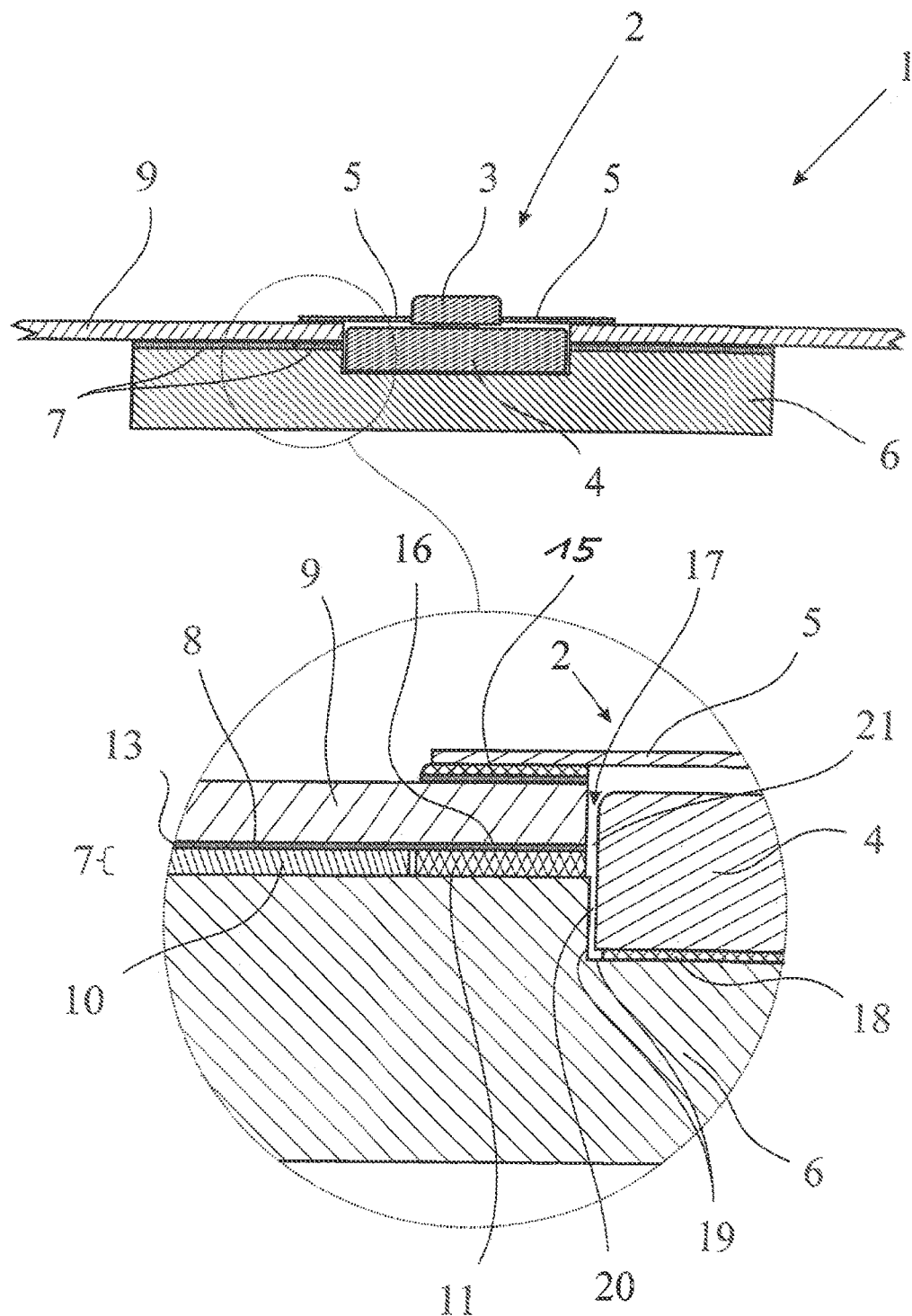
FIG. 2 shows the circuit board as shown in FIG. 1 in a vertical section.

The representation as shown in FIG. 2 reveals that the heat conducting element 6 is connected to a surface 8 of a sheet-like circuit board body 9 by way of a boundary layer 7. As explained above, the circuit board body 9 is the sheet-like arrangement of one or more individual layers, which may be copper-clad on one or both sides for the formation of traces.

Figure 3:
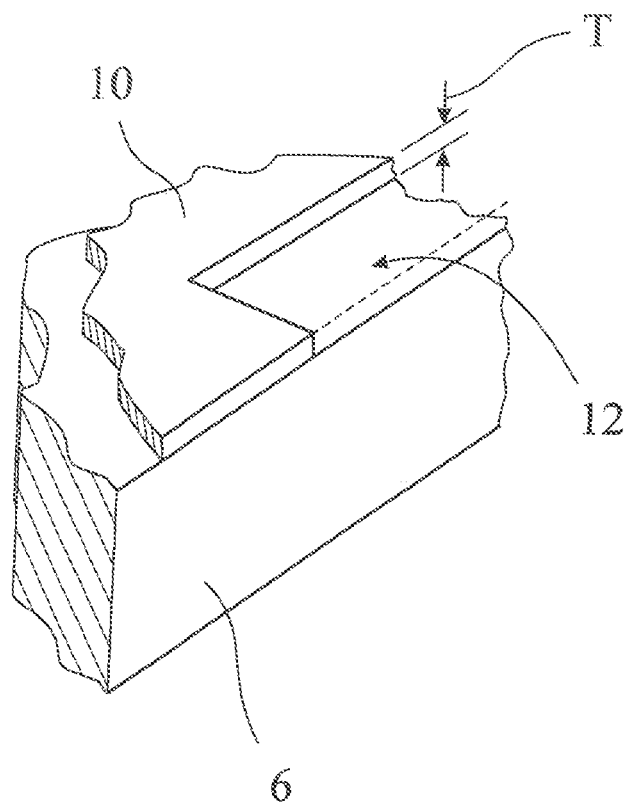
FIG. 3 shows the heat conducting element and a non-conducting layer of the circuit board as shown in FIG. 1 in a perspective detail.

The configuration of the boundary layer 7 between the heat conducting element 6 and the surface 8 of the circuit board body 9 is of particular importance in the present case. An essential factor is that the boundary layer 7 consists in certain areas of an electrically non-conducting layer 10 and in certain areas of an electrically conducting layer 11. In this case, the arrangement is set up in such a way that the non-conducting layer 10 combines with the circuit board body 9 and the heat conducting element 6 to provide at least one receiving space 12 (FIG. 3) with a pocket-like volume for the conducting layer 11. Of interest in this respect is the fact that the non-conducting layer 10 that is provided in any case is additionally used for defining a receiving space 12 for the conducting layer 11. The receiving space 12 may be completely closed or, as shown in FIG. 2, open on one side, in FIG. 2 towards the right.

In principle, it may be provided that the non-conducting layer 10 and the conducting layer 11 go over into one another in a substantially seamless manner. It is also conceivable, however, that a free volume is provided, at least in certain portions, between the two layers 10, 11.

It has also been explained above that the proposed solution opens up entirely new possibilities for the design of the conducting layer 11. In an embodiment, the conducting layer 11 is a meltable layer, in particular a solder layer, which can be melted in a soldering process still to be explained for the earthing of the heat conducting element 6.

The solder layer may for example be provided as a metal paste, as a metal foil or the like, which is melted for earthing in the still to be explained production of the circuit board 1.

However, the use of conductive adhesive, electrically conducting polymers, electrically conductive filled polymers, carbon-based materials, sintered materials or infiltration materials is also conceivable for the realization of the conducting layer 11.

Numerous variants are also conceivable for the realization of the non-conducting layer 10. Here, the non-conducting layer 10 is a thermally activatable adhesive film, which is activated by the effect of activation heat during the still to be explained production of the circuit board 1. Advantageous in the case of such an adhesive film is the fact that forms of almost any desired design are possible, since such an adhesive film can be punched into form in a simple way. At the same time, on account of a certain dimensional stability, such an adhesive film can be handled well in the still non-activated state.

The fact that the receiving space 12 is bounded on the one hand by the surface 8 of the circuit board body 9 and on the other hand by the heat conducting element 6 means that the pocket height T of the receiving space 12 (FIG. 3) can be easily set by the non-conducting layer 10 lying in between. Of interest in this respect is especially a configuration in which the pocket height T of the receiving space 12 is so small that, in its still liquid, in particular melted state, the conducting layer 11 is kept in the receiving space 12 by capillary action during the still to be explained production of the circuit board 1.

The arrangement can be set up in such a way that it is suitable for any orientation of the circuit board 1. It is also conceivable, however, that the arrangement is set up in such a way that, in its still liquid, in particular melted state, the conducting layer 10 is kept in the receiving space 12 by capillary action only when the circuit board 1 is horizontally aligned.

The pocket height T of the receiving space 12 may vary on the basis of the design of the electrically conducting layer 11. If the electrically conducting layer 11 is a meltable solder material, the pocket height T is can be less than 0.5 mm, or can be less than 0.1 mm.

In principle, the conducting layer 11 may serve for the connection of the heat conducting element 6 to any electric circuit-board potential. Here, however, it is the case that the conducting layer 11 provides an earth connection between the heat conducting element 6 and an earth layer 13 of the circuit board body 9. The earth layer 13 may be a copper-clad earth layer, which extends over the entire circuit board body 9, as shown in the drawing. In principle, the earth layer 13 may, however, also be formed in the manner of a trace.

In an embodiment, in the populated state of the circuit board 1, at least one electronic component 2, such as precisely one electronic component 2, is electrically contacted at the heat conducting element 6 and at at least one signal trace 14, in an embodiment a total of six signal traces 14, of the circuit board body 9. Furthermore, the heat conducting element 6 is electrically contacted by way of the conducting layer 11 at an earth layer 13 of the circuit board body 9, so that the earth return of the component 2 is ensured. In particular in the case of high-frequency applications, it is advantageous, as mentioned above, if the earth return takes place in the direct vicinity of the component 2, so that the creation of electromagnetic radiation is suppressed. In order to ensure this, at least one signal contact 15 on the upper side of the circuit board body 9 has lying opposite it an earth contact 16 on the underside of the circuit board body 9.

The terms "signal trace" and "signal contact" should be understood broadly in the present case and comprise all traces and contacts that can lead an electric potential to earth potential.

In an embodiment, it is the case that the heat conducting element 6 and the circuit board body 9 are of a planar configuration in the region of the boundary layer 7. It is also conceivable, however, that any desired surface topographies are provided there, in particular in order to influence the design of the receiving space 12.

FIG. 1 shows that the circuit board body 9 has a clearance 17 for receiving an electronic component 2. It is conceivable that multiple clearances 17 are provided and/or that one clearance 17 receives multiple electronic components 2. Alternatively, it may be provided that the clearance serves for receiving the heat conducting element 6. In this case, the heat conducting element 6 represented in FIG. 1 would be provided with a pedestal, which would at least partly protrude through the clearance 17. The connection of the heat conducting element 6 by way of the boundary layer 7 mentioned would not change however as a result.

In an embodiment it is the case that, in the populated state of the circuit board 1, an electronic component 2 assigned to the clearance 17 is in heat-conducting and electrical contact with the heat conducting element 6 in the region of the clearance 17. Here, the electronic component 2 protrudes through the clearance 17, in order to come into corresponding contact with the heat conducting element 6. FIG. 2 shows that the electronic component 2 is in surface-area contact with the heat conducting element 6. Further, in this case a solder layer 18 is provided between the heat conducting element 6 and the component 2.

In an embodiment, the heat conducting element 6 is provided with a trough-like formation 19, which serves for receiving the electronic component 2. The realization of such a trough-like formation 19 is an alternative to the aforementioned pedestal-like formation of the heat conducting element 6.

As mentioned above, especially in the case of high-frequency applications it must be ensured that the earth return is situated in direct proximity to the component 2. It is correspondingly proposed that the receiving space 12 for the conducting layer 11 is situated in the region of the clearance 17. In an embodiment represented in FIG. 2, the receiving space 12 for the conducting layer 11 is even situated right at the edge of the clearance 17, so that the receiving space 12 is open on one side towards the clearance 17. This ensures that the earth return is actually situated as close as possible to the component 2. Here, the aforementioned use of the capillary action in the receiving space 12 is found to be particularly advantageous. Without this capillary action there would be the risk in the case of the configuration represented in FIG. 2 that, in its liquid state, the conductive layer 11 could flow through a gap 20 between the component 2 and the heat conducting element 6 into the trough-like formation 19. In this case, the solder required for the earth contact would be missing in the receiving space 12, so that a malfunction would occur as a result. Furthermore, there would be the risk, promoted in turn by capillary action, that, in its liquid state, part of the electrically conductive layer 11 could flow through a gap 21 between the component 2 and the circuit board body 9 to the contact tongues 5.

As a result, the capillary action that keeps the conducting layer 11 in the receiving space 12 must be designed such that it exceeds the capillary action that "pulls" the conducting layer 11 upwards out of the receiving space 12 in FIG. 2.

According to further teaching, which is likewise is of importance in its own right, a method for the production of a circuit board 1 as proposed is claimed. In this respect, reference may be made to all of the comments made in relation to the circuit board 1 as proposed.

An essential factor according to this further teaching is that the boundary layer 7 for the connection of the heat conducting element 6 to the surface 8 of the sheet-like circuit board body 9 is produced in such a way that the boundary layer 7 consists in certain areas of an electrically non-conducting layer and in certain areas of an electrically conducting layer 11. An essential factor in this respect is the fact that the boundary layer 7 is built up in such a way that the non-conducting layer 10 combines with the surface 8 of the circuit board body 9 and the heat conducting element 6 to provide at least one receiving space 12 with a pocket-like volume for the conducting layer 11.

To produce the boundary layer 7, part of the conducting layer 11 is applied to the heat conducting element 6. This is represented in FIG. 1. This application can be a bonding application. In the event that the electrically conducting layer 11 is a metal foil that is meltable, it is conceivable that the metal foil is applied to the heat conducting element 6 in a bonding manner by a kind of laser welding process. It is also conceivable, however, that the metal foil is applied in an adhesive manner.

In principle, it is conceivable that the conducting layer 11 is applied to the circuit board body 9, such as in a bonding manner. It is also conceivable in this connection that the conducting layer 11 is applied in a bonding manner as part of the production process for the circuit board body 9.

The application of the conducting layer 11 may take place before or after the non-conducting layer 10 is applied to the heat conducting element 6 and/or the circuit board body 9. In the case represented in FIG. 1, the adhesive film could be placed onto the heat conducting element 6 already bearing the conducting layer 11. Alternatively, it would be conceivable to apply the adhesive film to the circuit board body 9, as long as corresponding centring mechanisms are provided.

Numerous variants, depending on the choice of material, are possible for the application of the non-conducting layer 10 and the conducting layer 11. These include, for example, dispensing, printing, attaching by way of thermal processes (soldering, ultrasonic soldering, welding, microwave welding, etc.), attaching by way of optical processes such as lasering or the like, spraying, mechanical connecting processes (pressing, stamping, crimping), chemical processes, sintering, adhesive bonding or sputtering.

After the application of the non-conductive layer 10 on the one hand and the conducting layer 11 on the other hand, the heat conducting element 6 is connected to the circuit board body 9 by way of the resultant boundary layer 7.

In an embodiment, the connection of the heat conducting element 6 to the circuit board body 9 takes place by the effect of activation heat. This process can also be combined with a pressing operation in the joining direction.

As already indicated, the non-conducting layer 10 can be a thermally activatable adhesive, in particular a thermally activatable adhesive film. It is then the case that the above activation heat activates the adhesive or the adhesive film, so that an adhesive connection is established between the heat conducting element 6 and the circuit board body 9. Of interest in this respect is the fact that the activation heat can be so little that it does not yet melt the conducting layer 11.

The result of the process steps so far is a circuit board 1 to which a heat conducting element 6 is attached. A conducting connection between the heat conducting element 6 and the circuit board body 9 that is envisaged for the use as intended is often not yet provided by the conducting layer 11. Furthermore, at this stage the circuit board 1 is unpopulated.

In a subsequent step, the circuit board 1 is then populated with the at least one electronic component 2 and soldered in a soldering process. The soldering process may be a reflow soldering process, a vapour-phase soldering process, a wave soldering process, a selective soldering process or the like. An essential factor in this respect is the fact that, during the soldering process, the conducting layer 11 is melted by the effect of activation heat attributable to the soldering process and enters into a soldered connection with the earth layer 13 on the one hand and the heat conducting element 6 on the other hand. At this point in time, the conducting layer 11 reaches its liquid state variously mentioned above, in which the likewise already mentioned capillary action within the receiving space 12 ensures that the conducting layer 11 remains in the receiving space 12.

As part of the above soldering process, the small metal plate 4 of the component 2 is also soldered onto the base of the trough-like formation 19 of the heat conducting element 6. The solder required for this may be introduced into the trough-like formation 19 in the form of a solder paste or the like, for example while the component 2 is being fitted.

It should also be pointed out that the non-conducting layer 10 and the conducting layer 11 may respectively comprise multiple sub-layers, that is to say may itself be of a multi-layered configuration. Furthermore, it should be pointed out that the boundary layer 7 may comprise not only the above non-conducting layer 10 and conducting layer 11, but also further layers.

Finally, it should be pointed out that the non-conducting layer 10 and the conducting layer 11 may be respectively configured as thermally conducting or thermally non-conducting.

The invention claimed is:

1. A circuit board for populating with at least one electronic component, comprising:
   at least one heat conducting element connected to a surface of a sheet-like circuit board body by way of a boundary layer, wherein the boundary layer comprises an electrically non-conducting layer and an electrically conducting layer, the non-conducting layer combining with the circuit board body and the heat conducting element to provide at least one receiving space with a pocket-like volume for the conducting layer,
   wherein the conducting layer is between the circuit board body and the heat conducting element,
   wherein a pocket height (T) of the receiving space is configured such that liquid, melted conducting layer is kept in the receiving space by capillary action during the production of the circuit board, wherein the pocket height (T) of the receiving space is determined by the layer thickness of the non-conducting layer, and
   wherein the heat conducting element has a trough-like formation for receiving the electronic component.

2. The circuit board according to claim 1, wherein the conducting layer consists of a meltable layer, and/or in that the non-conducting layer consists of a thermally activatable adhesive film.

3. The circuit board according to claim 2, wherein the meltable layer, comprises a solder layer.

4. The circuit board according to claim 1, wherein the conducting layer provides an earth connection between the heat conducting element and an earth layer of the circuit board body.

5. The circuit board according to claim 1, wherein in the populated state of the circuit board, at least one electronic component is electrically contacted at the heat conducting element and at least one signal trace of the circuit board body and in that the heat conducting element is electrically contacted by way of the conducting layer at an earth layer of the circuit board body.

6. The circuit board according claim 1, wherein the circuit board body has at least one clearance for receiving an electronic component or for receiving the heat conducting element.

7. The circuit board according to claim 1, wherein in the populated state of the circuit board, an electronic component assigned to the clearance is in heat-conducting and electrical contact with the heat conducting element in the region of the clearance.

8. The circuit board according to claim 7, wherein at least one signal contact on the upper side of the circuit board body has lying opposite it an earth contact on the underside of the circuit board body.

9. The circuit board according to claim 7, wherein the electronic component is in surface-area contact with the heat conducting element.

10. The circuit board according to claim 1, wherein the receiving space for the conducting layer is situated in the region of the clearance.

11. The circuit board according to claim 1, wherein the receiving space for the conducting layer is situated at the edge of the clearance, so that the receiving space is open on one side towards the clearance.

12. A method for the production of a circuit board comprising: a boundary layer for a connection of a heat conducting element to a surface of a sheet-like circuit board body being produced in such a way that the boundary layer consists in certain areas of an electrically non-conducting layer and in certain areas of an electrically conducting layer and the non-conducting layer combines with the surface of the sheet-like circuit board body and the heat conducting element to provide at least one receiving space with a pocket-like volume for the conducting layer; wherein a pocket height (T) of the receiving space is configured such that liquid, melted conducting layer is kept in the receiving space by capillary action during the production of the circuit board, wherein the pocket height (T) of the receiving space is determined by the layer thickness of the non-conducting layer.

13. The method according to claim 12, wherein to produce the boundary layer, at least part of the conducting layer is applied to the heat conducting element and/or to the circuit board body, before or after the non-conducting layer is applied to the heat conducting element and/or the circuit board body and in that the heat conducting element is subsequently connected to the circuit board body by way of the boundary layer.

14. The method according to claim 12, wherein the connection of the heat conducting element to the circuit board body takes place by the effect of activation heat.

15. The method according to claim 14, wherein the non-conducting layer consists of a thermally activatable adhesive.

16. The method according to claim 15, wherein a thermally activatable adhesive film, and in that the activation heat activates the adhesive or the adhesive film.

17. The method according to claim 12, wherein in a subsequent step, the circuit board is populated with at least one electronic component and soldered in a soldering process and in that, during the soldering process, the conducting layer is melted by the effect of heat attributable to the soldering process.

\* \* \* \* \*